(12) United States Patent
Bessonov

(10) Patent No.: US 10,985,319 B2
(45) Date of Patent: Apr. 20, 2021

(54) METHOD OF FORMING AN APPARATUS COMPRISING PEROVSKITE

(71) Applicant: EMBERION OY, Espoo (FI)

(72) Inventor: Alexander Bessonov, Cambridge (GB)

(73) Assignee: EMBERION OY, Espoo (FI)

(*) Notice: Subject to any disclaimer, the term of this patent is extended or adjusted under 35 U.S.C. 154(b) by 169 days.

(21) Appl. No.: 16/308,884

(22) PCT Filed: Jun. 14, 2017

(86) PCT No.: PCT/FI2017/050440
§ 371 (c)(1),
(2) Date: Dec. 11, 2018

(87) PCT Pub. No.: WO2017/216423
PCT Pub. Date: Dec. 21, 2017

(65) Prior Publication Data
US 2020/0313091 A1    Oct. 1, 2020

(30) Foreign Application Priority Data

Jun. 15, 2016   (EP) ..................................... 16174531

(51) Int. Cl.
*H01L 51/42*   (2006.01)
*H01L 51/00*   (2006.01)
(Continued)

(52) U.S. Cl.
CPC ............ *H01L 51/0018* (2013.01); *G03F 1/42* (2013.01); *G03F 7/162* (2013.01); *G03F 7/2002* (2013.01);
(Continued)

(58) Field of Classification Search
CPC ............... H01L 51/0018; H01L 51/428; H01L 51/4253; H01L 51/5296; H01L 51/5032;
(Continued)

(56) References Cited

U.S. PATENT DOCUMENTS 5,350,705 A * 9/1994 Brassington ...... H01L 27/10808
257/295
2014/0152948 A1* 6/2014 Chae ................. G02F 1/133345
349/110

(Continued)

FOREIGN PATENT DOCUMENTS

JP   2005-263582 A   9/2005

OTHER PUBLICATIONS

Youngbin Lee et al., "High-Performance Perovskite-Graphene Hybrid Photodetector," Advanced Materials, vol. 27, 2015, pp. 41-46.
(Continued)

*Primary Examiner* — Vu A Vu
(74) *Attorney, Agent, or Firm* — Squire Patton Boggs (US) LLP

(57) ABSTRACT

A method comprising: providing a substrate comprising one or more electronic structures; providing a layer of perovskite overlaying the one or more electronic structures; coating a layer of photoresist material overlaying the layer of perovskite; aligning a mask with the one or more electronic structures and patterning the photoresist material; and using the same etchant to remove sections of the patterned photoresist material and the perovskite underneath the sections of the photoresist material.

6 Claims, 5 Drawing Sheets

Figure 1:
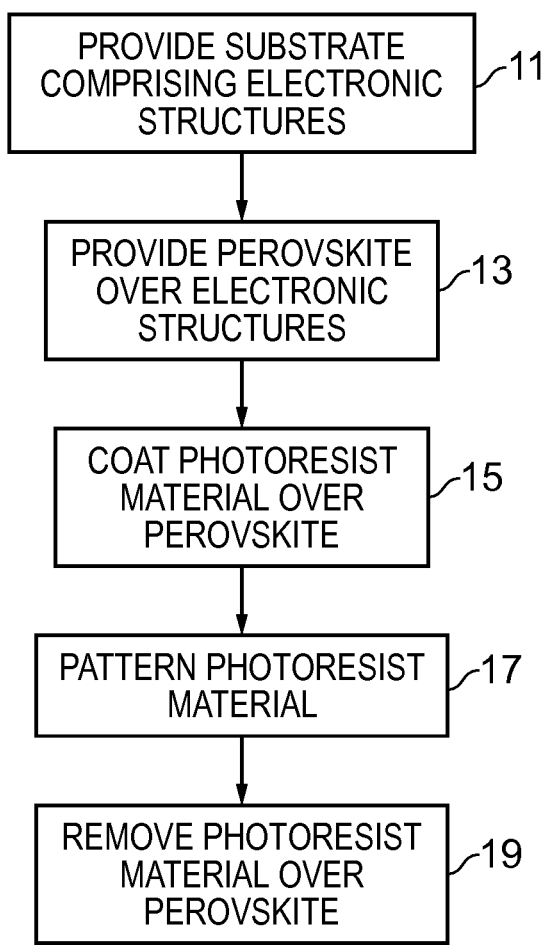

(51) Int. Cl.
| | |
|---|---|
| G03F 1/42 | (2012.01) |
| G03F 7/16 | (2006.01) |
| G03F 7/20 | (2006.01) |
| H01G 9/00 | (2006.01) |
| H01G 9/20 | (2006.01) |
| H01L 51/50 | (2006.01) |
| H01L 51/52 | (2006.01) |

(52) U.S. Cl.
 CPC ......... H01G 9/0036 (2013.01); H01G 9/2009 (2013.01); H01L 51/428 (2013.01); H01L 51/4253 (2013.01); H01L 51/5032 (2013.01); H01L 51/5296 (2013.01); *H01L 51/0077* (2013.01)

(58) Field of Classification Search
 CPC .............. H01L 51/0077; H01G 9/2009; H01G 9/0036; G03F 1/42; G03F 7/162; G03F 7/2002
 USPC .......................................................... 438/99
 See application file for complete search history.

(56) References Cited

U.S. PATENT DOCUMENTS

| | | | |
|---|---|---|---|
| 2014/0284302 A1 | 9/2014 | Hahiro | |
| 2014/0291842 A1* | 10/2014 | Ang | H01L 25/0657 257/738 |

OTHER PUBLICATIONS

Wikipedia article on Photolithography, www.wikipedia.org., 2 pages.
International Search Report & Written Opinion dated Dec. 15, 2017 corresponding to International Patent Application No. PCT/FI2017/050440.
European Search Report dated Nov. 17, 2016 corresponding to European Patent Application No. 16174531.
Dmitry Lyashenko et al., "High-resolution patterning of organohalide lead perovskite pixels for photodetectors using orthogonal photolithography," In: Physica Status Solidi A Wiley-VCH Verlag GmbH & Co., Oct. 2016, vol. 214, No. 1, pp. 1-7.
Photolithography, from Wikipedia, the free encyclopedia. [online], Apr. 12, 2016, retrieved from https://web.archive.org/web/20160412023308/https://en.wikipedia.org/wiki/Photolithography>.
Hung-Chieh Cheng et al., "van der Waals Heterojunction Devices Based on Organohalide Perovskites and Two-Dimensional Materials," In: Nano Letters American Chemical Society, Dec. 2015, vol. 16, No. 1, pp. 367-373.
Youngbin Lee et al., "High-Performance Perovskite-Graphene Hybrid Photodetector," In: Advanced Materials WILEY-VCH Verlag GmbH & Co., Oct. 2014, vol. 27, No. 1, pp. 41-46.
Vinh Quang Dang et al., "Methylammonium lead iodide perovskite-graphene hybrid channels in flexible broadband phototransistors," In: Carbon Elsevier, Apr. 2016, vol. 105, pp. 353-361.
Notice of Preliminary Rejection issued in corresponding Korean Patent Application No. 10-2018-7033535 dated Jan. 22, 2021, with English translation thereof.
Yuxiang Wu et al., "Organic-inorganic hybrid CH3NH3PbI3 perovskite materials as channels in thin-film field-effect transistors", RSC Advances, Feb. 2016, vol. 6, pp. 16243-16249.

* cited by examiner

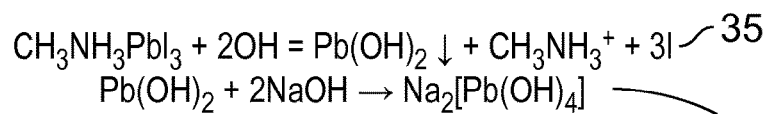
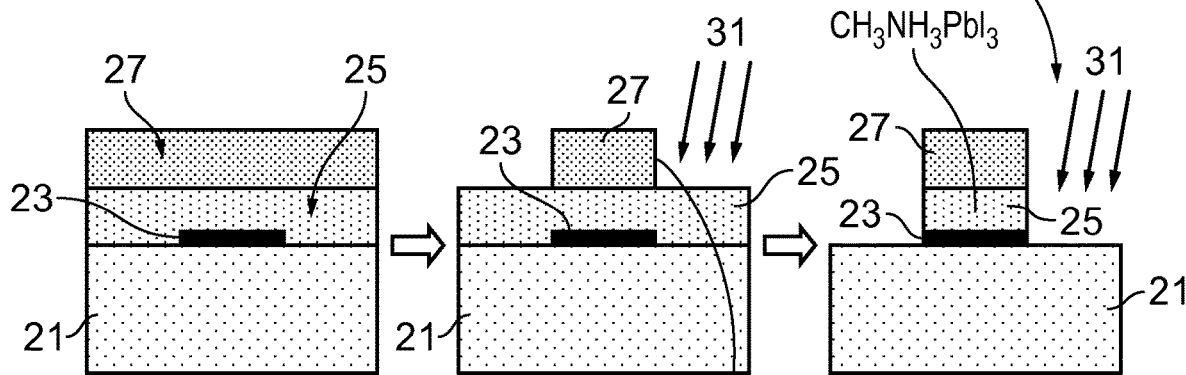
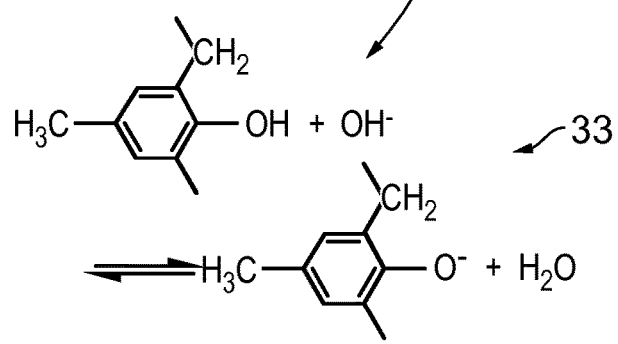

METHOD OF FORMING AN APPARATUS COMPRISING PEROVSKITE

TECHNOLOGICAL FIELD

Examples of the disclosure relate to a method of forming an apparatus comprising perovskite. In particular, they relate to a method of forming an apparatus comprising perovskite where the perovskite forms part of one or more electronic structures.

BACKGROUND

Perovskite materials such as hybrid organic-inorganic perovskites can be used as optoelectronically active layers in electronic devices such as photodetectors, photo-emitters or any other suitable apparatus. However it is difficult to structure perovskite into a predefined pattern which makes it difficult to fabricate electronic devices using perovskite.

It is useful to provide improved methods of forming an apparatus comprising perovskite.

BRIEF SUMMARY

According to various, but not necessarily all, examples of the disclosure there is provided a method comprising: providing a substrate comprising one or more electronic structures; providing a layer of perovskite overlaying the one or more electronic structures; coating a layer of photoresist material overlaying the layer of perovskite; aligning a mask with the one or more electronic structures and patterning the photoresist material; and using the same etchant to remove sections of the patterned photoresist material and the perovskite underneath the sections of the photoresist material.

The photoresist material may be patterned to correspond with the structures of the one or more electronic structures.

The patterning of the photoresist material may comprise exposing the photoresist material to ultraviolet light through the mask.

The etchant may remove photoresist material that was not exposed to ultraviolet light. The etchant may also remove the perovskite that was underneath the photoresist material that was not exposed to ultraviolet light.

The etchant may remove photoresist material that was exposed to ultraviolet light.

The etchant may also remove the perovskite that was underneath the photoresist material that was exposed to ultraviolet light.

The electronic structures may comprise two dimensional material.

The two dimensional material may comprise graphene.

The method may comprise removing remaining photoresist material.

The method may comprise encapsulating the substrate and the perovskite layer.

The perovskite layer may be coated on the substrate so that it forms an electrical connection with the one or more electronic structures on the substrate.

According to various, but not necessarily all, examples of the disclosure there is provided an apparatus formed using the methods described above.

According to various, but not necessarily all, examples of the disclosure there is provided examples as claimed in the appended claims.

BRIEF DESCRIPTION

Figure 2:
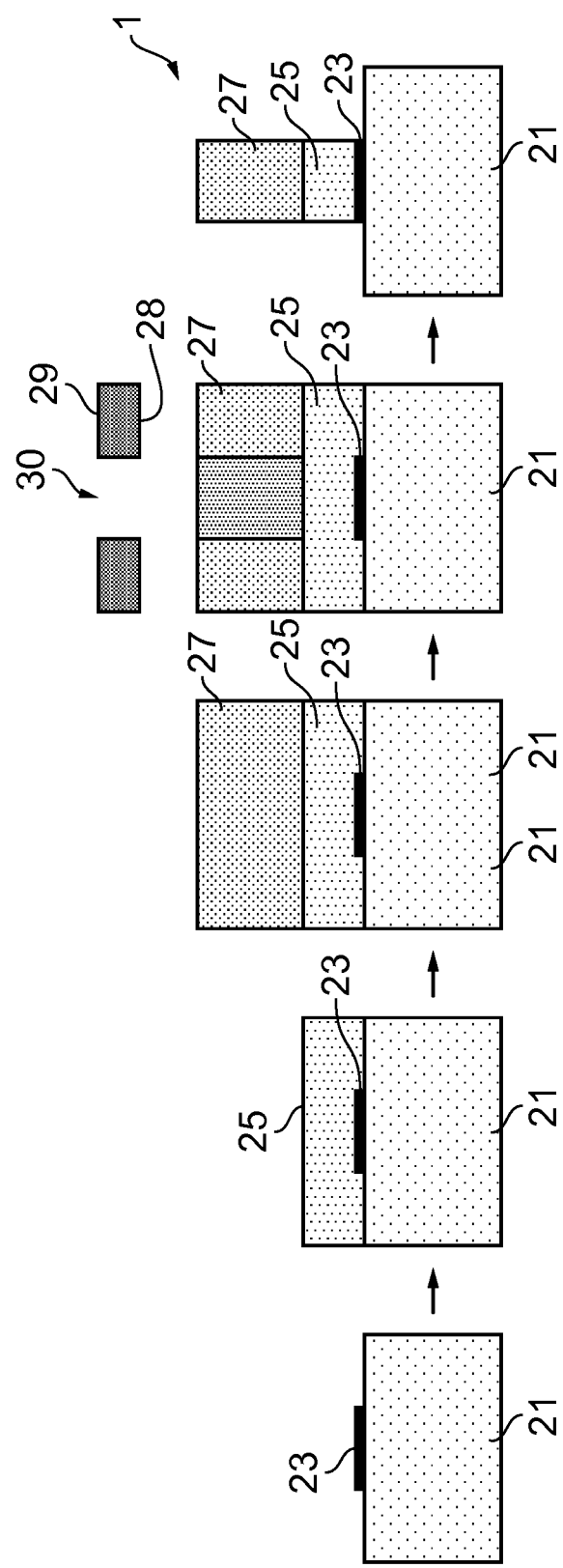
Figure 4:
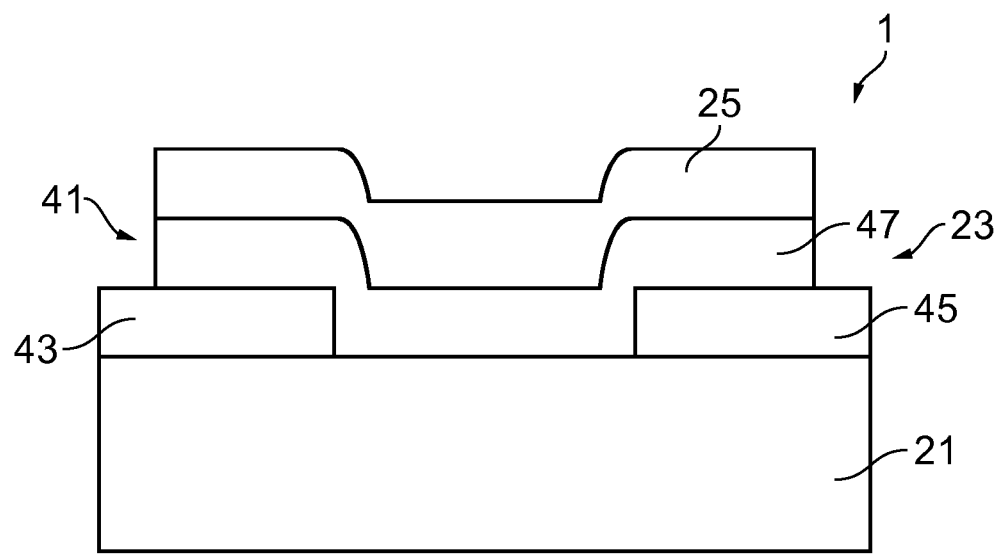
Figures 5A, 5B:
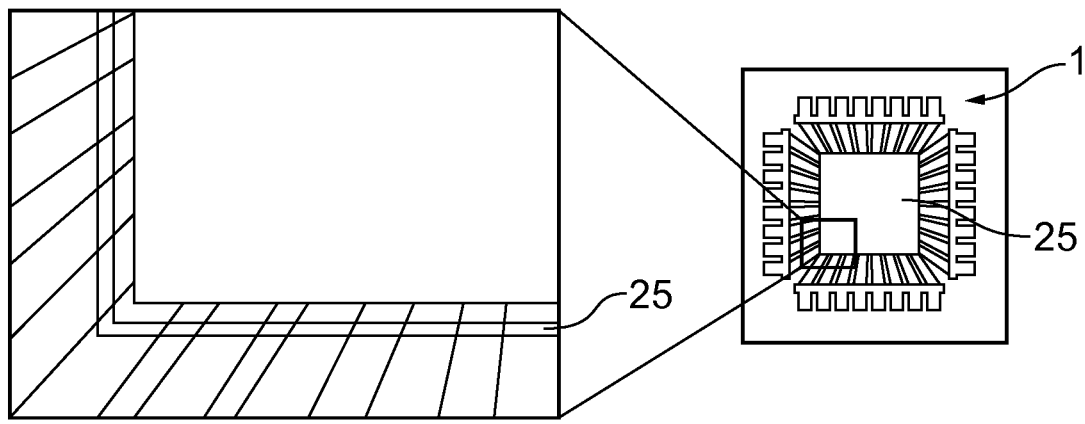

For a better understanding of various examples that are useful for understanding the detailed description, reference will now be made by way of example only to the accompanying drawings in which:

FIG. 1 illustrates a method;
FIG. 2 illustrates a method;
FIGS. 3A to 3C illustrate a method;
FIG. 4 schematically illustrates an apparatus formed using methods according to examples of the disclosure;
FIGS. 5A and 5B illustrate an example apparatus formed using methods according to examples of the disclosure; and
FIGS. 6A to 6I illustrate example apparatus formed using methods according to examples of the disclosure.

DETAILED DESCRIPTION

The figures illustrate a method. The method comprises providing 11 a substrate 21 comprising one or more electronic structures 23; coating 13 a layer of perovskite 25 overlaying the one or more electronic structures 23; coating 15 a layer of photoresist material 27 overlaying the layer of perovskite 25; aligning 17 a mask 29 with the one or more electronic structures 23 and patterning the photoresist material 27; and using 19 the same etchant 31 to remove sections of the patterned photoresist material 27 and the perovskite 25 underneath the sections of the patterned photoresist material 27.

The method may be for forming an apparatus 1 comprising perovskite 25. The apparatus 1 could be an optoelectronic device such as a graphene field effect transistor (GFET) where the perovskite 25 is used as a photoactive material to functionalise a graphene channel or any other suitable type of apparatus 1. The optoelectronic device could be arranged to detect incident light and/or may be arranged to emit light. The perovskite 25 may provide an optoelectronically active layer within the apparatus 1.

FIG. 1 illustrates a method of forming an apparatus 1 according to examples of the disclosure. Examples of an apparatus 1 that may be formed using such methods are illustrated in FIGS. 4 to 6.

The method comprises, at block 11, providing a substrate 21 comprising one or more electronic structures 23.

The substrate 21 may be any suitable substrate 21 which comprises a surface onto which the one or more electronic structures 23 can be mounted.

The substrate 21 may comprise any suitable material. In some examples the substrate 21 may comprise silicon. In some examples the substrate 21 may comprise a polymer material which may comprise, polyethylene terephthalate (PET), polyethylene naphthalate (PEN), polyethersulfone (PES), polyimide (PI), or any other suitable material.

One or more electronic structures 23 may be provided on the surface of the substrate 21. The electronic structures 23 could comprise complete electronic devices such as nanoelectronic devices. In some examples the electronic structures may comprise components which form part of the electronic devices. The electronic structures 23 could comprise any electronic components such as electrodes, electrical contacts, or any other suitable components.

In some examples the electronic structures 23 may comprise a two dimensional material. The two dimensional material may comprise a very thin layer of material. In some examples the two dimensional material could be an atomic monolayer. In some examples the two dimensional material could comprise several atomic monolayers. The two dimensional material could comprise graphene or any other suitable material. The use of the two dimensional material may enable nanoelectronic devices to be formed.

In some examples at least some of the electronic structures 23 may be fabricated on the surface of the substrate 21. In such examples the electronic structures 23 may be formed using any suitable technique. For instance, the electrodes and other conductive traces could be printed on the surface of the substrate 21 or evaporated onto the surface of the substrate 21. The two dimensional material could be deposited so that it is in electrical contact with the electrodes. In some examples the two dimensional material could be deposited over the electrodes or the electrodes could be formed overlaying the two dimensional material. In other examples the electronic structures 23 may be fabricated on a different substrate and then transferred to the substrate 21.

At block 13 the method comprises providing 13 a layer of perovskite 25 overlaying the one or more electronic structures 23.

The perovskite 25 may comprise a crystalline material with the formula $ABX_3$ where A and B are cations and X is an anion. In some examples the perovskite 25 may comprises a hybrid organic-inorganic perovskite 25. In some examples the perovskite 25 may comprise an organometal halide perovskite 25. In such materials one or more of the cations may be an organic cation. The inorganic anion may comprise a halide.

In some examples the perovskite 25 may have the formula $ABX_3$: where $A=CH_3NH_3$ (MA), $NH_2CH=NH_2$ (FA); $B=Pb, Sn$; $X=Cl, Br, I$. For instance the perovskite 25 may comprise $CH_3NH_3PbI_3$, $CH_3NH_3PbBr_3$, $CH_3NH_3PbBr_xI_{3-x}$, $CH_3NH_3PbCl_xI_{3-x}$ or any other suitable material.

The perovskite 25 may comprise an optoelectronically active material. The optoelectronically active material may be arranged to provide an electrical output in response to incident light and/or emit light in response to an electrical input. In some examples the perovskite 25 may be arranged to be sensitive to electromagnetic radiation which is outside the visible range. For instance, the perovskite 25 could be sensitive to x-rays or any other suitable type of radiation. In such examples the perovskite 25 may comprise a hybrid organic-inorganic perovskite in which the A cation is a monovalent cation. In some examples the perovskite 25 may comprise an organometal-halide perovskite such as $CH_3NH_3PbI_3$. Other materials may be used in other examples of the disclosure.

In some examples the perovskite 25 may comprise a composite material. For instance in some examples the perovskite 25 may comprise a composite of quantum dots within a perovskite 25. In some examples the quantum dots may comprise colloidal quantum dots. In such examples the quantum dots may comprise PbS, PbSe, PbTe, CdS, CdSe or any other suitable material.

The perovskite 25 may be provided on the substrate 21 using any suitable process. In some examples the perovskite 25 may be provided on the substrate 21 using spin coating, drop casting, slot-die casting, inkjet printing, vapour deposition or any other suitable process. The thickness of the perovskite may be between 10 nm to 1 mm. Other thicknesses may be used in other examples of the disclosure.

The perovskite 25 may be provided onto the substrate 21 so that the perovskite 25 overlays at least some of the electronic structures 23 on the surface of the substrate 21.

The perovskite 25 may be coated on the substrate 21 so that it forms an electrical connection with the one or more electronic structures 23 on the substrate. For instance in examples where the electronic structures 23 comprise a two dimensional material such as graphene the perovskite 25 may be coated in a layer overlaying the graphene. At least part of the layer of perovskite 25 may be in electrical contact with the graphene. This may enable electrical charges to be transferred between the graphene and the layer of perovskite 25.

At block 15 the method comprises coating a layer of photoresist material 27 overlaying the layer of perovskite 25.

The photoresist material 27 may comprise any light sensitive material which may be used to form patterns. In some examples of the disclosure the photoresist material 27 may be sensitive to ultraviolet light. In examples of the disclosure the photoresist material 27 may be selected so that sections of the photoresist material 27 that are not exposed to ultraviolet light are soluble in an etchant while the sections of the photoresist material 27 that are exposed to ultraviolet light are insoluble in the etchant.

It is to be appreciated that in other examples different types of photoresist material 27 may be used. In other examples the sections of the photoresist material 27 that are exposed to ultraviolet light may be soluble in an etchant and the sections of the photoresist material that are not exposed to ultraviolet light are insoluble in the etchant.

The photoresist material 27 may be deposited using any suitable process such as spin coating.

The photoresist material 27 may be coated onto the perovskite 25 so that it directly overlays the perovskite 25. The photoresist material 27 may directly overlay the perovskite 25 so that there are no intervening layers between the photoresist material 27 and the perovskite 25.

At block 17 the method comprises aligning a mask 29 with the one or more electronic structures 23. The mask 29 may be used to pattern the photoresist material 27 by enabling some sections to be exposed to ultraviolet light while other sections are shielded from the ultraviolet light.

The mask 29 may be positioned overlaying the photoresist material 27. The mask 29 may be positioned so that the gaps in the mask 27 are aligned with the electronic structures 23 and/or with components of the electronic structures 23 on the surface of the substrate 21. This enables the sections of the photoresist material 27 that overlay the electronic structures 23 to be exposed to ultraviolet light.

Once the mask 29 is positioned so that it is aligned with the electronic structures 23 the apparatus 1 may be exposed to ultraviolet light. The sections of photoresist material 27 that are underneath gaps in the mask will be exposed to ultraviolet light and may be hardened or otherwise become insoluble in response to the ultraviolet light. The sections of the photo resist material 27 that are not underneath the gaps in the mask 29 will not be hardened and will remain soluble.

It is to be appreciated that other types of photoresist material 27 could be used in other examples of the disclosure. In other examples the sections of photoresist material 27 that are not underneath gaps in the mask and are not exposed to ultraviolet light may be hardened or otherwise become insoluble. Similarly in such examples, the sections of the photoresist material 27 that are underneath the gaps in the mask 29 and are exposed to ultraviolet light will become hardened and become soluble.

In some examples the patterning process may comprise additional processes in addition to the exposure to ultraviolet light. For instance, in some examples the apparatus 1 may be heated to cure the photoresist material. In some examples the apparatus may be exposed to chemicals which may enable the photoresist material 27 to be developed.

At block 19 the method comprises removing sections of the patterned photoresist material 27 and the perovskite 25 underneath the sections of patterned photoresist material 27 using the same etchant 31. The etchant 31 may be used to develop the photoresist material 27. The etchant 31 may remove the photoresist material 27 that not was positioned underneath gaps in the mask 29 and so was not exposed to ultraviolet light. The etchant may also remove the sections of the perovskite 25 that were positioned underneath the sections of the photoresist material 27 that was not exposed to ultraviolet light.

The etchant 31 does not remove the sections of the photoresist material 27 that were exposed to ultraviolet light. As the gaps in the mask 29 were aligned with the electronic structures 23 this leaves sections of the photo resist material 27 overlaying the electronic structures 23. As the photo resist material 27 is not removed the perovskite 25 material which is underneath the photo resist material 27 is also not removed. This leaves section of the perovskite 25 overlaying the electronic structures 23 and may enable the sections of the perovskite 25 to form part of the electronic devices on the substrate 21.

As the mask 29 may have a well defined structure this may enable the sections of the perovskite 25 which remain on the substrate 21 to also have a well defined structure.

The mask 29 may be selected so that the shapes of the remaining sections of the perovskite 25 correspond to the shapes of the electronic structures 23.

The sections of the patterned photoresist material 27 and the perovskite 25 may be removed using any suitable etchant 31. The etchant 31 that is used may be dependent upon the material that is used for the perovskite 25 and the photoresist material 27. The etchant 31 may be a wet etchant. The etchant 31 could be an alkaline or organic solvent based etchant or any other suitable material.

As the same etchant 31 is used to remove both the sections of patterned photoresist material 27 and the perovskite 25 this enables the sections of the patterned photoresist material 27 and sections of the perovskite 25 to be removed in a single processing step. The etching rate may be controlled by controlling the temperature at which the etching is carried out and/or the concentration of the etchant. The etching rate may be increased by increasing the temperature and/or increasing the concentration of the etchant.

The etchant 31 that is used may depend on the materials that are used for the perovskite 25 and the photoresist material 27. In some examples the etchant 31 may comprise an alkaline etcher such as KOH, NaOH or a polar organic solvents such as propylene glycol methyl ether acetate (PGMEA, 1-methoxy-2-propanol acetate dimethylformamide (DMF), gamma-butyrolactone (GBL), cyclopentanone, dimethyl sulfoxide (DMSO), acetonitrile, acetone, or any other suitable etchant 31.

FIG. 2 illustrates an apparatus 1 during stages of a method according to examples of the disclosure.

The method comprises providing 11 a substrate 21. The substrate 21 may be any suitable substrate 21. The substrate 21 may be as described above. In the examples of FIG. 2 the substrate 21 is a flat or substantially flat substrate 21.

One or more electronic structures 23 may be provided on the surface of the substrate 21. The electronic structures 23 may comprise a two dimensional material such as graphene. The electronic structures 23 may have well defined structures and shapes. For instance the electrodes, conductive traces and channels between electrodes may all have well defined shapes. The well defined shapes may be formed by printing, vacuum deposition or any other suitable techniques.

A layer of perovskite 25 is provided over the surface of the substrate 21 and the one or more electronic structures 23 that are provided on the surface of the substrate 21. The perovskite 25 could comprise any suitable material which may be as described above.

In the example of FIG. 2 the layer of perovskite 25 is coated so that it covers the entire surface of the substrate 21. The layer of perovskite 25 therefore also covers all of the electronic structures 23 that are provided on the surface of the substrate 21.

In other examples the layer of perovskite 25 may be provided so that it only covers part of the surface of the substrate 21. In such examples the layer of perovskite 25 may cover some of the electronic structures 23 but not others.

A layer of photoresist material 27 is coated 15 over the perovskite 25. The photo resist material 27 may comprise any suitable material which may be as described above.

In the example of FIG. 2 the layer of photoresist material 27 is coated so that it covers the entire surface of the perovskite 25. The layer of photoresist material 27 therefore also covers the surface of the substrate 21 and all of the electronic structures 23 that are provided on the surface of the substrate 21.

In other examples the layer of photoresist material 27 may be provided so that it only covers part of the perovskite 25 and the surface of the substrate 21.

Once the photoresist material 27 has been coated the photoresist material 27 is patterned. In the example method of FIG. 2 the photoresist material 27 is patterned by positioning a mask 29 over the photoresist material 27 and exposing the apparatus 1 to ultraviolet light through the mask 29.

The mask 29 comprises a layer which has a first area 28 which is opaque to the ultraviolet light and a second area 30 which is transparent to ultraviolet light. The second area 30 may comprise a gap or discontinuity in the mask.

The mask 29 may be positioned over the photoresist material so that the second areas of the mask 29 are positioned overlaying the electronic structures 23. In some examples the mask 29 may be positioned so that the second areas 30 of the mask 29 are positioned overlaying specific components of the electronic structures 23. For instance, in some examples the mask 29 may be positioned so that the second areas 30 are positioned overlaying the components of the electronic structures 23 which comprise two dimensional material.

When the mask 29 is in the correct position the apparatus 1 is exposed to ultraviolet light. The first area 28 of the mask 29 shields the photoresist material 27 positioned underneath the first area 28. This prevents the photoresist material 27 positioned underneath the first area 28 from being exposed to ultraviolet light. This section of photoresist material 27 will not undergo any chemical change and will remain soluble in the etchant 31.

The second area 30 of the mask 29 is transparent to ultraviolet radiation and so the photoresist material 27 that is positioned underneath the second area 30 will be exposed to ultraviolet light. This section of photoresist material 27 will undergo a chemical change and may become insoluble in the etchant 31.

The method also comprises using 19 an etchant 31 to remove sections of the patterned photoresist material 27.

The etchant 31 removes the sections of the photoresist material 27 that were positioned underneath the first area 28 of the mask 29. The same etchant 31 is also used to remove the sections of the perovskite 25 that were positioned underneath the first area 28 of the mask 29.

In the example of FIG. 2 once the sections of the photoresist material 27 and the perovskite 25 have been removed a structured section of perovskite 25 is left on the surface of the substrates 21. In the example of FIG. 2 the structured section of perovskite is positioned so that it overlays an electronic structure on the substrate 21. This may enable the perovskite 25 to form an optoelectronically active layer of the electronic structure 23.

In the example of FIG. 2 a section of the photoresist material 27 is left on the substrate 21. The remaining section of the photoresist material 27 may form part of the apparatus 1. The remaining photoresist material 27 may provide a barrier layer which may protect the perovskite 25 and the other components positioned beneath the perovskite 25. The barrier layer may protect the perovskite 25 and the other components from oxygen, moisture or any other contaminants that may degrade the apparatus 1.

It is to be appreciated that in some examples the method may comprise other processes which are not illustrated above. For instance in some examples an encapsulation process may be performed to provide a protective barrier layer around the apparatus 1 or portions of the apparatus 1.

FIGS. 3A to 3C illustrate some blocks of the example methods in more detail.

In FIG. 3A the layer of perovskite 25 and the layer of photoresist material 27 are provided overlaying the substrate 21 and the electronic structures 23 on the substrate 21. The layer of perovskite 25 and the layer of photoresist material 27 may have been coated using any suitable process such as spin coating.

In the example of FIG. 3A the photoresist material 27 comprises a phenolic resin. In some examples the resin may comprise novolac, a cresol resin which is polymerized from formaldehyde and phenol. Other photoresist materials 27 may be used in other examples of the disclosure.

In the example of FIG. 3A the perovskite 25 comprises a hybrid organic-inorganic perovskite such as $CH_3NH_3PbI_3$. Other perovskites 25 may be used in other examples of the disclosure.

In FIG. 3B the layer of photoresist material 27 has been patterned and the etching process has begun. The photoresist material 27 may be patterned using any suitable process. In the example of FIG. 3B the section of the photoresist material 27 overlaying the electronic structure 23 has been hardened so that is insoluble in the etchant 31. The section of the photoresist 27 overlaying the electronic structure 23 may be the section that has not been exposed to ultraviolet light. In other examples the section of the photoresist 27 overlaying the electronic structure 23 may be the section that has been exposed to ultraviolet light The apparatus 1 is exposed to an etchant 31. In the example of FIG. 3 the etchant 31 comprises an aqueous alkaline solution such as NaOH, KOH, $NH_4OH$ or any other suitable solution.

In FIG. 3B the section of the photoresist material 27 which is not overlaying the electronic structure 23 is dissolved in the aqueous alkaline solution. This removes a section of the photoresist material 27 from the apparatus 1. FIG. 3B shows an example reaction 33 between the photoresist material 27 and the aqueous alkaline solution.

Once the section of the photoresist material 27 has been removed a section of the perovskite 25 becomes exposed to the etchant 31. In the example of FIG. 3C the hybrid organic-inorganic perovskite is also dissolved by the aqueous alkaline solution. FIG. 3C shows an example reaction 35 between the perovskite 25 and the aqueous alkaline solution.

Once the perovskite has been removed by the etchant this leaves a section of the surface of the substrate 21 exposed.

As the section of the photoresist material 27 which is overlaying the electronic stricture 23 is not soluble in the etchant 31 this leaves a portion of the photoresist material 27 on the substrate 21. This also leaves the portion of the perovskite material 25 underneath the cured photoresist material 27. The perovskite 25 may be in electronic contact with the electronic structures 23 and may form part of the electronic devices.

In some examples the remaining section of photoresist material 27 may be left on the apparatus 1 so that the photoresist material 27 forms a protective barrier for components of the apparatus 1. In other examples the remaining photoresist material 27 may be removed. The remaining photoresist material 27 may be removed by using another etchant which dissolves the remaining photoresist material 27 but does not dissolve the perovskite 25, or by any other suitable means. In some examples the other etchant could comprise an alcohol based solvent such as methanol or any other suitable material.

FIG. 4 schematically illustrates an apparatus 1 which may be formed by methods according to examples of the disclosure. In the example of FIG. 4 the apparatus comprises an electronic structure. In the example of FIG. 4 the electronic structure is a field effect transistor such as a graphene field effect transistor (GFET) 41. Other electronic components may be used in other examples of the disclosure.

The GFET 41 comprises a source electrode 43, a drain electrode 45 and a graphene channel 47. The source electrode 43 and the drain electrode 45 may be formed from any suitable conductive material. In some examples the source electrode 43 and the drain electrode 45 may be fabricated on the surface of the substrate 21. For instance the electrodes 43, 45 may be printed on the surface of the substrate 21. In some examples the electrodes 43, 45 may be arranged to reduce the contact resistance between the electrodes 43, 45 and the graphene channel 47. For instance, the electrodes may comprise a layer of metal on the surface of the graphene channel 47 or any other suitable technique may be used.

The graphene channel 47 extends between the source electrode 43 and the drain electrode 45. The graphene channel 47 may be arranged in electrical contact with the source electrode 43 and the drain electrode 45 so that the graphene channel 47 provides a conductive path between the source and drain electrodes 43, 45.

The layer of perovskite 25 is provided overlaying the graphene channel 47. The layer of perovskite 25 may be in electrical contact with the graphene channel 47 so that charges may be transferred between the graphene channel 47 and the perovskite 25. The layer of perovskite 25 may be deposited and patterned using the example methods described above.

As the perovskite 25 may produce a charge in response to incident light this arrangement may enable the GFET 41 to be used to detect incident light.

In the example of FIG. 4 the perovskite 25 is provided overlaying the graphene channel 47 with no intervening components. In other examples there may be one or more intervening components between the graphene channel 47 and the perovskite 25.

It is to be appreciated that the example apparatus of FIG. 4 is an example and other variations may be used in other examples of the disclosure. For instance in some examples the GFET 41 may comprise a gate electrode or other additional components. In other examples the apparatus 1 may comprise components other than GFETs 41.

FIGS. 5A and 5B illustrate an example apparatus 1 formed using methods according to examples of the disclosure. In the example of FIGS. 5A and 5B the apparatus 1 comprises a GFET. The GFET comprises a structured layer of perovskite 25 overlaying the graphene channel 47. FIG. 5A shows a plan view of the apparatus land FIG. 5B shows a close up of a section of the GFET 41. These figures show that the method can be used to form a well defined perovskite structure 25 that can form part of an electronic device.

FIGS. 6A to 6I illustrate more example apparatus 1 which may be formed by methods according to examples of the disclosure. In the examples of FIGS. 6A to 6I the perovskite 25 comprises $MAPbI_3$. The electronic structures 23 comprise gold electrodes provided on a silicon and plastic substrate 21.

Figures 6A, 6B, 6C, 6D:
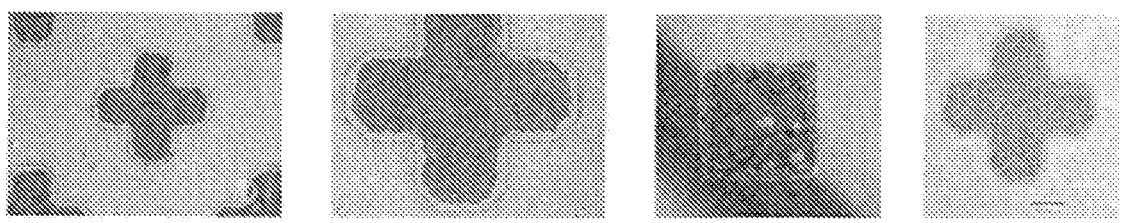

The examples of FIGS. 6A to 6I show different shapes that can be formed using the method. FIGS. 6A to 6D show example apparatus 1 where all of the photoresist material 27 has been removed. The example of FIG. 6A shows a cross shaped structure, FIG. 6B shows a close up of the cross shaped structure. FIG. 6C shows a squares shaped structure and FIG. 6D also shows a cross shaped structure.

Figures 6E, 6F, 6G:
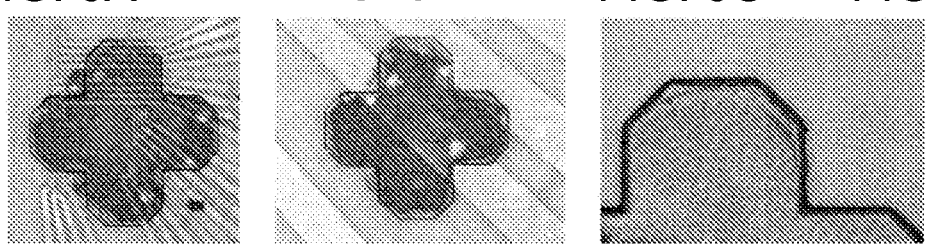
Figures 6H, 6I:
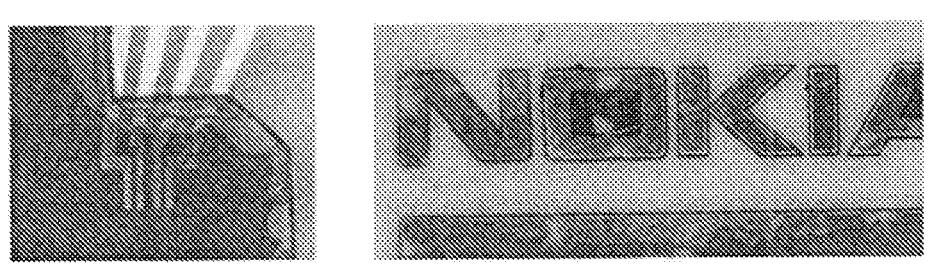

FIGS. 6E to 6I show examples apparatus 1 where some of the photoresist material 27 has been left on the substrate 21 overlaying the perovskite 25. FIGS. 6E and 6F show cross shaped structures, and FIGS. 6G and 6H show close ups of the cross shaped structure. FIG. 6I shows a structure spelling out the word "NOKIA".

It is to be appreciated that other shaped structures may be used in other examples of the disclosure.

Examples of the disclosure provide a method which may be used to form well defined perovskite 25 structures. This enables electronic devices such as GEFTs 41 or other nanoelectronic devices to be formed comprising a perovskite 25 layer.

In examples of the disclosure sections of the perovskite 25 and sections of the photoresist material 27 are removed using the same etchant 31. This enables the perovskite 25 and the photoresist material 27 to be removed in a single step and also enables the well defined perovskite 25 structures to be formed.

The term "comprise" is used in this document with an inclusive not an exclusive meaning. That is any reference to X comprising Y indicates that X may comprise only one Y or may comprise more than one Y. If it is intended to use "comprise" with an exclusive meaning then it will be made clear in the context by referring to "comprising only one . . . " or by using "consisting".

In this brief description, reference has been made to various examples. The description of features or functions in relation to an example indicates that those features or functions are present in that example. The use of the term "example" or "for example" or "may" in the text denotes, whether explicitly stated or not, that such features or functions are present in at least the described example, whether described as an example or not, and that they can be, but are not necessarily, present in some of or all other examples. Thus "example", "for example" or "may" refers to a particular instance in a class of examples. A property of the instance can be a property of only that instance or a property of the class or a property of a sub-class of the class that includes some but not all of the instances in the class. It is therefore implicitly disclosed that a features described with reference to one example but not with reference to another example, can where possible be used in that other example but does not necessarily have to be used in that other example.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

The invention claimed is:

1. A method comprising:
   providing a substrate comprising one or more electronic structures;
   providing a layer of perovskite overlaying the one or more electronic structures;
   coating a layer of photoresist material overlaying the layer of perovskite;
   aligning a mask with the one or more electronic structures and patterning the photoresist material; and
   using the same etchant to remove sections of the patterned photoresist material and the perovskite underneath the sections of the photoresist material,
   wherein the perovskite comprises a hybrid organic-inorganic perovskite with the formula $ABX_3$: where $A=CH_3NH_3$, $NH_2CH=NH_2$; B=Pb, Sn; X=Cl, Br, I and the etchant is an alkaline or organic solvent based etchant.

2. A method as claimed in claim 1, wherein the patterning of the photoresist material comprises exposing the photoresist material to ultraviolet light through the mask.

3. A method as claimed in claim 2 wherein the etchant removes photoresist material that was not exposed to ultraviolet light.

4. A method as claimed in claim 3 wherein the etchant also removes the perovskite that was underneath the photoresist material that was not exposed to ultraviolet light.

5. A method as claimed in claim 2 wherein the etchant removes photoresist material that was exposed to ultraviolet light.

6. A method as claimed in claim 5 wherein the etchant also removes the perovskite that was underneath the photoresist material that was exposed to ultraviolet light.

\* \* \* \* \*